(12) United States Patent
Alenin et al.

(10) Patent No.: US 7,394,316 B1
(45) Date of Patent: Jul. 1, 2008

(54) HIGH SPEED, HIGH CURRENT GAIN VOLTAGE BUFFER AND METHOD

(75) Inventors: Sergey Alenin, Tucson, AZ (US); Henry Surtihadi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/655,708

(22) Filed: Jan. 19, 2007

Related U.S. Application Data

(60) Provisional application No. 60/824,223, filed on Aug. 31, 2006.

(51) Int. Cl.
*H03F 3/26* (2006.01)

(52) U.S. Cl. ....................... 330/267; 330/263
(58) Field of Classification Search ................. 330/255, 330/262, 263, 267
See application file for complete search history.

(56) References Cited

U.S. PATENT DOCUMENTS 7,078,973 B2 * 7/2006 Alenin ....................... 330/267
7,102,440 B2 9/2006 Damitio et al. ............. 330/267

* cited by examiner

*Primary Examiner*—Khanh V Nguyen
(74) *Attorney, Agent, or Firm*—Wade J. Brady, III; Frederick J. Telecky, Jr.

(57) ABSTRACT

An amplifying circuit which may be useful in a diamond buffer amplifier or operational amplifier includes an input transistor including an emitter, a collector, and a base coupled to receive an input voltage. An adjustable current source circuit is coupled between a first reference voltage and the emitter of the input transistor. A current source is coupled between a second reference voltage and the collector of the input transistor. An isolation resistor has a first terminal coupled to an output terminal of the adjustable current source circuit and a second terminal coupled to the emitter of the input transistor. A current follower circuit is coupled between the collector of the input transistor and an input terminal of the adjustable current source circuit. A feed-forward capacitor is coupled between the collector of the input transistor and the first terminal of the isolation resistor.

18 Claims, 3 Drawing Sheets

US 7,394,316 B1

HIGH SPEED, HIGH CURRENT GAIN VOLTAGE BUFFER AND METHOD

RELATED APPLICATIONS

The present invention claims priority from U.S. Provisional Patent Application No. 60/824,223, filed Aug. 31, 2006.

BACKGROUND OF THE INVENTION

The present invention relates generally to so-called diamond buffer amplifiers, and more particularly to diamond buffer amplifiers having substantially improved slew rate performance and high current gain at high frequencies.

FIG. 1 shows a simple prior art diamond buffer amplifier 1A, which is similar to well-known basic diamond follower circuits. In FIG. 1, an input signal Vin is coupled to the bases of a PNP input transistor Q4 and an NPN input transistor Q3. The emitter of input transistor Q3 is coupled by conductor 5 to a constant current source $I_1$ and also to the base of a PNP output transistor Q2. Similarly, the emitter of input transistor Q4 is coupled by conductor 4 to a constant current source $I_2$ and also to the base of an NPN output transistor Q1.

The current gain of diamond buffer amplifier 1A of FIG. 1 is $\beta_{npn} \times \beta_{pnp}$, which can be considered to be simply $\beta^2$. In some cases, the current gain is too low because $\beta^2$ is too low. Also, the current Iout delivered by diamond buffer amplifier 1A is limited by the value of $I_2 \times \beta_{npn}$ associated with sourcing current to the base of output transistor Q1, and because Iout also is limited by the value of $I_1 \times \beta_{pnp}$ associated with sinking current from the base of output transistor Q2. (In theory, at maximum values of Iout, for either current sourcing or current sinking operation, all of the $I_2$ or $I_1$ current will go to the base of transistor Q1 or transistor Q2, respectively.) Low values of $\beta_{npn}$ and $\beta_{pnp}$ also set a limit to the ratio of the quiescent current of diamond buffer amplifier 1A to the maximum value of output current Iout and therefore can limit the effectiveness of diamond buffer amplifier 1A. (The explanation for this is that if high Iout is desired and $\beta$ is low, it is necessary to increase $I_2$ and $I_1$, thus increasing total quiescent current.) The slew rate of diamond buffer amplifier 1A is determined by the parasitic capacitances of the bases of output transistors Q1 and Q2 and by the currents $I_2$ and $I_1$ available to charge and recharge their parasitic base capacitances, respectively. (The base capacitances referred to consist mainly of the base-collector junction capacitances and also the amount of any load capacitance divided by $\beta$.)

FIG. 2 is a simplified schematic diagram of a diamond buffer amplifier 1B which is described in commonly owned U.S. Pat. No. 7,102,440 entitled "High Output Current Wideband Output Stage/Buffer Amplifier" issued Sep. 5, 2006 to Damitio et al. and incorporated herein by reference. Diamond buffer amplifier 1B is an improvement over the one shown in FIG. 1. Referring to FIG. 2, one of the prior art techniques for partially resolving the above-mentioned problems associated with low values of $I_2 \times \beta_{npn}$ and $I_1 \times \beta_{pnp}$ (i.e., limiting the magnitude of Iout and limiting the ratio of the quiescent current of the diamond buffer amplifier to the maximum value of Iout) is to provide controlled current source circuits 11 and 10 in place of constant current sources $I_1$ and $I_2$, respectively. The controlled current sources 11 and 10 are implemented with transistors Q5 and Q6, respectively, and associated local current feedback loops which keep the operating currents of input transistors Q3 and Q4 stable while providing the bases of the output transistors Q1 and Q2 with the required amounts of current by adjusting the currents in transistors Q5 and Q6.

Controlled current source circuit 10, which replaces constant current source $I_2$ of FIG. 1, includes PNP transistor Q6 and also includes a constant current source $I_6$ connected between $V_{CC}$ and conductor 6. Conductor 6 also is connected to the collector of an NPN transistor Q8, the base of which receives a bias voltage Bias2. The emitter of transistor Q8 is connected by conductor 8 to the collector of input transistor Q4 and to a constant current source $I_4$. Similarly, controlled current source circuit 11, which replaces constant current source $I_1$ of FIG. 1, includes NPN transistor Q5 and also includes a constant current source $I_5$ connected between $V_{EE}$ and conductor 7. Conductor 7 also is connected to the collector of a PNP transistor Q7, the base of which receives a bias voltage Bias1. The emitter of transistor Q7 is connected by conductor 9 to the collector of input transistor Q3 and to a constant current source $I_3$.

As an example, if the input voltage Vin, and hence the output voltage Vout, go to a high voltage, output transistor Q1 sources the current Iout to the load (not shown), and the base current of output transistor Q1 increases, thereby "stealing" a portion of the emitter current of input transistor Q4. This causes the collector current of input transistor Q4 to decrease, which increases the collector current of transistor Q8 by the same amount of current lost to the base current of output transistor Q1. The increased collector current of transistor Q8 turns transistor Q6 on harder, which amplifies the additional current in the collector of transistor Q8 by the current gain $\beta$ of transistor Q6. (The current gain $\beta$ of transistor Q6 is the ratio of its collector current $I_C$ to its base current $I_B$.) Transistor Q6 will then "reimburse" the current "stolen" from the collector of transistor Q4 and thereby return the operating current of input transistor Q4 to its normal level. Consequently, the current gain of the circuitry including transistors Q1, Q4, and Q6 is high, i.e., $\beta_{Q4} \times \beta_{Q6} \times \beta_{Q1}$, for current sourcing operation. The term $\beta_{Q4} \times \beta_{Q6} \times \beta_{Q1}$ can be considered to be simply $\beta^3$. The current gain of the circuitry including transistors Q2, Q3 and Q5 is equal to $\beta_{Q3} \times \beta_{Q5} \times \beta_{Q2}$ for current sinking operation, which also can be considered to be simply $\beta^3$. The maximum output current is $(I_4-I_6) \times \beta_{Q6} \times \beta_{Q1}$ for current sourcing operation, and $(I_3-I_5) \times \beta_{Q5} \times \beta_{Q2}$ for current sinking operation, i.e., about one $\beta$ factor better than for the circuit of FIG. 1. The controlled current sources 10 and 11 can also provide much higher slewing currents and therefore much better slew rates.

Still referring to FIG. 2, in a practical circuit the "local" feedback loops around the "pre-output" transistors Q5 and Q6 require some frequency compensation. An implementation of such frequency compensation is shown in FIG. 3, wherein the high impedance nodes at the base conductors 6 and 7 of controlled current source transistors Q5 and Q6 are slowed down with grounded compensation capacitors C1 and C2, and the transconductances (Gm) of transistors Q5 and Q6 are lowered by emitter degeneration resistors R1 and R2. The dominant pole frequency is lowered and "split" from a second pole associated with the base capacitances of the output transistors Q1 and Q2 and output resistances at the emitter nodes of the pre-output stage transistors Q3 and Q4. (Without frequency compensation, the first and second poles are too close together, just as in a typical operational amplifier structure there will insufficient phase margin. If the dominant pole is located closer to zero frequency so there is much larger separation between the dominant pole and the secondary pole, then adequate phase margin is obtained. note, however, that there is a distinction between the local loops that to be compensated and the overall operational amplifier loop, and that the present invention is not directed to compensating the overall operational amplifier.)

Unfortunately, the foregoing frequency compensation technique shown in FIG. 3 does not allow the currents in controlled current source transistors Q5 and Q6 to rise very fast to immediately deliver the maximum current and rapid recharging of the parasitic base capacitances of output transistors Q1 and Q2. As a result, the buffer amplifier 1C of FIG. 3 is not much better than the simple one shown in "Prior Art" FIG. 1 with regard to slew rate and current gain at high frequency.

Thus, there is an unmet need for buffer amplifier circuitry that provides a high slew rate and high current gain at high frequencies.

There also is an unmet need for a diamond buffer amplifier that provides a high slew rate and high current gain at high frequencies.

SUMMARY OF THE INVENTION

It is an object of the invention to provide buffer amplifier circuitry having both high slew rate and high current gain at high frequencies.

It is another object of the invention to provide buffer amplifier circuitry, having both high-slew-rate and high current gain at high frequencies, which can be used as a building block in amplifier circuitry.

It is another object of the invention to provide a diamond buffer amplifier having both high slew rate and high current gain at high frequencies.

Briefly described, and in accordance with one embodiment, the present invention provides amplifying circuitry (24A,B) which includes an input transistor (Q3) including an emitter, a collector, and a base coupled to receive an input voltage (Vin). An adjustable current source circuit (11) is coupled between a first reference voltage ($V_{EE}$) and the emitter of the input transistor (Q3). A current source ($I_3$) is coupled between a second reference voltage ($V_{CC}$) and the collector of the input transistor (Q3). An isolation resistor (R1) has a first terminal (15) coupled to an output terminal (15) of the adjustable current source circuit (11) and a second terminal (5) coupled to the emitter of the input transistor (Q3). A current follower circuit (Q7,Q9) is coupled between the collector of the input transistor (Q3) and an input terminal (7) of the adjustable current source circuit (11). A feed-forward capacitor (C1) is coupled between the collector (9) of the input transistor (Q3) and the first terminal (15) of the isolation resistor (R1).

In one embodiment, the invention provides amplifying circuitry including a first input transistor (Q3) having an emitter, a collector, and a base coupled to receive an input voltage (Vin). A first adjustable current source circuit (11) is coupled between a first reference voltage ($V_{EE}$) and the emitter of the first input transistor (Q3). A first current source ($I_3$) is coupled between a second reference voltage ($V_{CC}$) and the collector of the first input transistor (Q3). First isolation circuitry (R1) having a first terminal (15) is coupled to an output terminal (15) of the first adjustable current source circuit (11) and a second terminal (5) is coupled to the emitter of the first input transistor (Q3). First current follower circuitry (Q7,Q9) is coupled between the collector of the first input transistor (Q3) and an input terminal (7) of the first adjustable current source circuit (11). A first feed-forward capacitor (C1) is coupled between the collector (9) of the first input transistor (Q3) and the first terminal (15) of the first isolation circuitry (R1). The first feed-forward capacitor (C1) functions above a predetermined frequency to provide a high speed short circuit feed-forward path between emitter and collector of the first input transistor (Q3).

In one embodiment, the first input transistor (Q3) is an NPN transistor, and the first, second, and third electrodes are the emitter, collector, and base of the first input transistor (Q3). The first isolation circuitry (R1) is a first resistor (R1). In another embodiment, the first input transistor (Q4) is a PNP transistor, and the first, second, and third electrodes are the emitter, collector, and base of the first input transistor (Q4).

In one embodiment, the amplifying circuitry (20) includes a first output transistor (Q2) having an emitter coupled to an output conductor (3) conducting an output voltage (Vout), a collector coupled to the first reference voltage ($V_{EE}$), and a base coupled to the emitter of the first input transistor (Q3). The first output transistor (Q2), the first input transistor (Q3), the first adjustable current source circuit (11), the first current source ($I_3$), the first isolation circuitry (R1), of the first current follower circuitry (Q7,Q9), and the first feed-forward capacitor (C1) are included in a first amplifying circuit (24A). The amplifying circuitry (20) also includes a second amplifying circuit (24B). The second amplifying circuit (24B) includes a second input transistor (Q4) having an emitter, a collector, and a base coupled to receive the input voltage (Vin), a second adjustable current source circuit (10) coupled between the second reference voltage ($V_{CC}$) and the emitter of the second input transistor (Q4), a second current source ($I_4$) coupled between the first reference voltage ($V_{EE}$) and the collector of the second input transistor (Q4), second isolation circuitry (R2) having a first terminal (14) coupled to an output terminal (14) of the second adjustable current source circuit (10) and a second terminal (4) coupled to the emitter of the second input transistor (Q4), second current follower circuitry (Q8,Q10) coupled between the collector (8) of the second input transistor (Q4) and an input terminal (6) of the second adjustable current source circuit (10), a second feed-forward capacitor (C2) coupled between the collector (8) of the second input transistor (Q4) and the first terminal (14) of the second isolation circuitry (R2), and the second output transistor (Q1) having an emitter coupled to the output conductor (3) conducting the output voltage (Vout), a collector coupled to the second reference voltage ($V_{CC}$), and a base coupled to the emitter of the second input transistor (Q4).

The first input transistor (Q3) and the first output transistor (Q2) of the first amplifying circuit (24A) can be NPN and PNP transistors, respectively, and the first input transistor (Q4) and the second output transistor (Q1) of the second amplifying circuit (24B) can be PNP and NPN transistors, respectively. In the described embodiment, the first current follower circuitry (Q7,Q9) includes a PNP transistor (Q7) having an emitter coupled to the collector of the first input transistor (Q3) and a base coupled to receive a first bias voltage (Bias1), and the first current follower circuitry (Q7,Q9) includes a PNP series current follower transistor (Q9) having an emitter coupled to a collector of the PNP transistor (Q7), a base coupled to receive the input voltage (Vin), and a collector coupled to the input terminal (7) of the first adjustable current source circuit (1). The first feed-forward capacitor (C1) has a first terminal (13) coupled to the emitter of the PNP series current follower transistor (Q9) and a second terminal (15) coupled to the first terminal of the first isolation circuitry (R1). The second current follower circuitry (Q8, Q10) includes an NPN transistor (Q8) having an emitter coupled to the collector of the second input transistor (Q4) and a base coupled to receive a second bias voltage (Bias2), and the second current follower circuitry (Q8,Q10) includes an NPN series current follower transistor (Q10) having an emitter coupled to a collector of the NPN transistor (Q8), a base coupled to receive the input voltage (Vin), and a collector coupled to the input terminal (6) of the second adjustable current source circuit (10). The second feed-forward capacitor (C2) has a first terminal (12) coupled to the emitter of the NPN series current follower transistor (Q10) and a second terminal (14) coupled to the first terminal of the first isolation circuitry (R2).

The first adjustable current source circuit (11) includes a third current source (15) coupled between the collector of the PNP series current follower transistor (Q9) and the first reference voltage ($V_{EE}$). The collector of the PNP series current follower transistor (Q9) is coupled to a base of a NPN current source output transistor (Q5) having an emitter coupled to the first reference voltage ($V_{EE}$) and a collector coupled to the first terminal (15) of the first isolation circuitry (R1). The second adjustable current source circuit (10) includes a fourth current source ($I_6$) coupled between the collector of the NPN series current follower transistor (Q10) and the second reference voltage ($V_{CC}$), the collector of the NPN series current follower transistor (Q10) being coupled to a base of a PNP current source output transistor (Q6) having an emitter coupled to the second reference voltage ($V_{CC}$) and a collector coupled to the first terminal (14) of the second isolation circuitry (R2).

In one embodiment, the invention provides a method of amplifying an input signal (Vin), including applying an input voltage (Vin) to a base of a first input transistor (Q3) and a base of a first current follower transistor (Q9), operating a first adjustable current source circuit (11) to produce a first current and directing the first current through a first isolation resistor (R1) and an emitter of the first input transistor (Q3), causing a change in a collector current of the first input transistor (Q3) to flow into an emitter of the first current follower transistor (Q9), causing a change in a collector current of the first current follower transistor (Q9) to flow into a control input (7) of the first adjustable current source circuit (11), and coupling a first feed-forward capacitor (C1) between the emitter of the first current follower transistor (Q9) and an output (15) of the first adjustable current source circuit (11), to produce a first signal voltage (5) on the emitter of the first input transistor (Q3) having wide bandwidth and high current gain at high frequency operation. This is accomplished without coupling a substantial amount of compensation capacitance to the input (7) of the first adjustable current source circuit (11). In one embodiment, the amplifying circuit is operated by coupling the first signal voltage (5) to a base of an output transistor (Q2). The amplifying circuit is operated at a frequency greater than a predetermined frequency to cause the first feed-forward capacitor (C1) to provide a high speed short circuit feed-forward path between the emitter and collector of the first input transistor (Q3).

In one embodiment, the invention provides an amplifying circuit for amplifying an input signal (Vin), including means for applying an input voltage (Vin) to a base of a first input transistor (Q3) and a base of a first current follower transistor (Q9), means for operating a first adjustable current source circuit (11) to produce a first current and directing the first current through a first isolation resistor (R1) and an emitter of the first amplification transistor (Q3), means for causing a change in a collector current of the first input transistor (Q3) to flow into an emitter of the first current follower transistor (Q9), means for causing a change in a collector current of the first current follower transistor (Q9) to flow into a control input (7) of the first adjustable current source circuit (11), and means for coupling a first feed-forward capacitor (C1) between the emitter of the first current follower transistor (Q9) and an output (15) of the first adjustable current source circuit (11), to produce a first signal voltage (5) on the emitter of the first input transistor (Q3) having wide bandwidth and high current gain at high frequency operation.

DETAILED DESCRIPTION OF THE PREFERRED EMBODIMENTS

Figure 4:
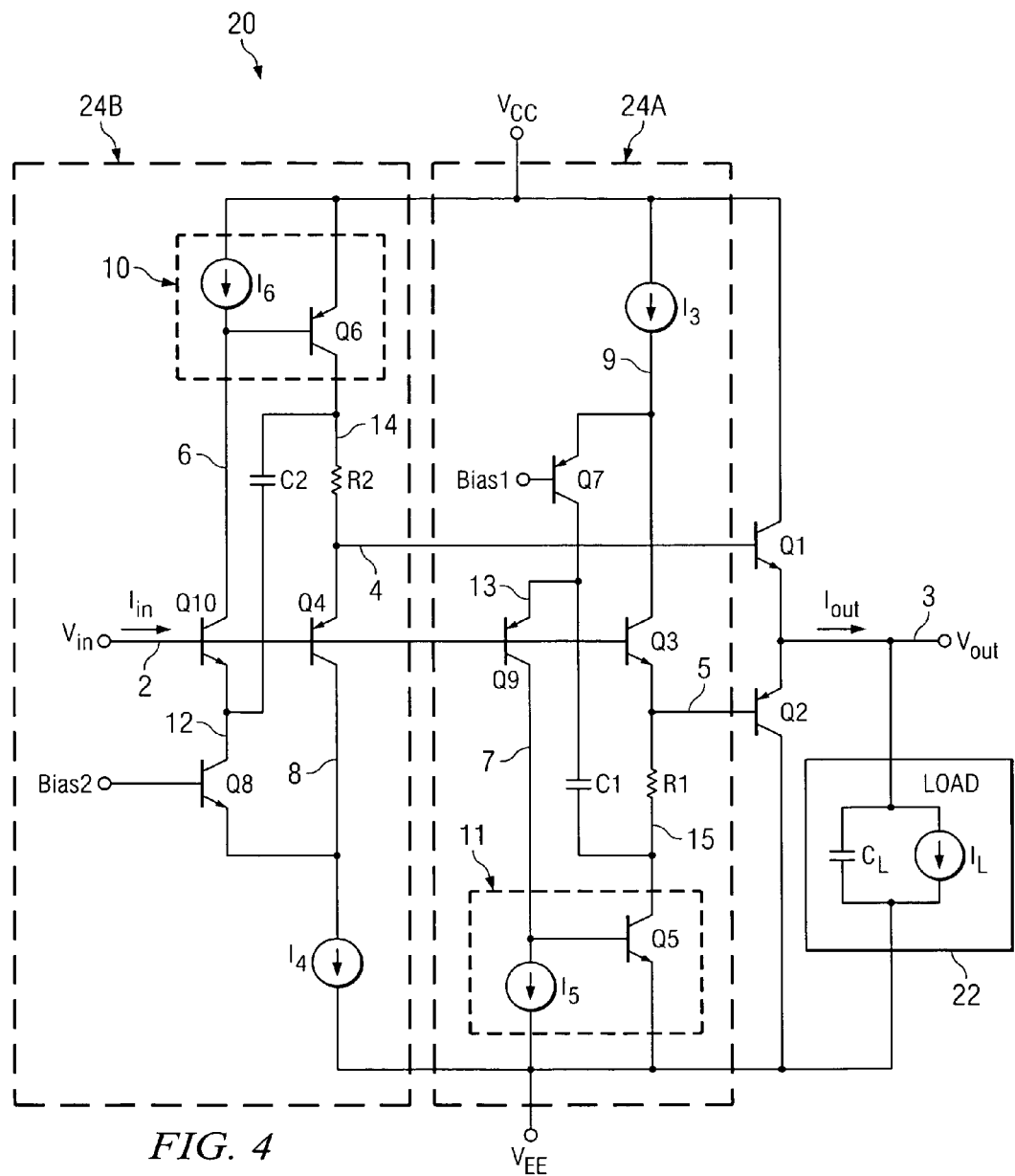
FIG. 4 is a schematic diagram of a diamond buffer amplifier of the present invention.

Referring to FIG. 4, in diamond buffer amplifier 20 the input voltage Vin is coupled to the bases of PNP input transistor Q4 and NPN input transistor Q3. The emitter of input transistor Q3 is coupled by conductor 5 to the base of PNP output transistor Q2 and also is coupled by isolation resistor R1 and conductor 15 to controlled current source 11. Similarly, the emitter of input transistor Q4 is coupled by conductor 4 to the base of NPN output transistor Q1 and also is coupled to one terminal of isolation resistor R2, the other terminal of which is connected by conductor 14 to an output terminal of controlled current source 10. (Isolation resistors R1 and R2 may have, for example, a resistance of roughly 1 kilohm.) Controlled current source circuit 10 includes PNP transistor Q6 and constant current source $I_6$ connected between $V_{CC}$ and conductor 6, which is the control input of controlled current source 10. The emitter of PNP transistor Q6 is connected to $V_{CC}$, its collector is connected to conductor 14, and its base is connected to conductor 6.

Conductor 6 also is connected to the collector of an NPN transistor Q10, the base of which is coupled to Vin by conductor 2. The emitter of transistor Q1 is connected by conductor 12 to the collector of NPN transistor Q8, the base of which receives a bias voltage Bias2. The emitter of transistor Q8 is connected by conductor 8 to the collector of input transistor Q4 and to one terminal of constant current source $I_4$, the other terminal of which is connected to $V_{EE}$. A capacitor C2 is connected between conductor 12 and conductor 14.

Similarly, controlled current source circuit 11 includes NPN transistor Q5 and constant current source $I_5$. Constant current source $I_5$ is connected between $V_{EE}$ and conductor 7. The emitter of NPN transistor Q5 is connected to $V_{EE}$, and its collector connected by conductor 15 to one terminal of isolation resistor R1, the other terminal of which is connected to conductor 5. Conductor 7 also is connected to the collector of an NPN transistor Q9, the base of which is connected to Vin. The emitter of transistor Q9 is connected by conductor 13 to the collector of PNP transistor Q7, the base of which receives a bias voltage Bias1. (Transistor Q7 can be thought of as a "common base" amplifier transistor.) The emitter of common base amplifier transistor Q7 is connected by conductor 9 to the collector of input transistor Q3 and to one terminal of constant current source $I_3$, the other terminal of which is connected to $V_{CC}$. A feed-forward capacitor C1 is connected between conductor 13 and conductor 15.

Transistors Q9 and Q10 function as series current followers in local feedback loops to control the currents of controlled current source output transistors Q5 and Q6. Transistor Q9 provides a buffering voltage-level-shift function which tracks input voltage Vin. Since the base of transistor Q9 is connected to Vin, the emitter voltage of transistor Q9 is one $V_{BE}$ voltage higher than Vin. The emitter node of transistor Q9 is an appropriate node for connection to one terminal of feed-forward capacitor C1 while the other terminal of capacitor C1 is connected to conductor 15. Since conductor 13 and conductor 15 both track the input voltage Vin, there is minimal charging and discharging of feed-forward capacitor C1 when the input voltage is being applied, thus improving the slew rate of the output stage. Similarly, transistor Q10 provides an appropriate node for connection to one terminal of feed-forward capacitor C2 while its other terminal is connected to conductor 14, and this also minimizes the charging and discharging of C2 when input voltage is applied. Although transistors Q9 and Q10 do not change the operation of the feedback, they appear to make the feedback a little slower due to the additional phase shift they introduce. However, the reduction or elimination of the need for dominant-pole compensation capacitance due to the operation of transistors Q9 and Q10 provides a very significant improvement in the circuit operating speed and hence in the slew rates.

Resistor R1, rather than reducing the transconductance Gm of transistor Q5, instead functions to provide a suitable amount of electrical isolation of the collector of transistor Q5 from conductor 5 and the large parasitic capacitance associated with the base of output transistor Q2. Feed-forward capacitor C1 closes a local feedback loop in the amplification circuitry including transistors Q9 and Q5. Specifically, feed-forward capacitor C1 closes the local feedback loop at high frequency, not through transistors Q3 and Q7, but through the much shorter path consisting of the low AC impedance of feed-forward capacitor C1.

Because of the electrical isolation achieved by resistor R1 between the collector of transistor Q5 and the base capacitance of transistor Q2, the amplification circuitry including transistors Q9 and Q5 is sufficiently stable that minimal or no local frequency compensation capacitance is required. With no need for additional compensation capacitance, the amplifying circuitry can be very fast, wherein transistor Q9 supplies current to the parasitic base capacitance of output transistor Q2 through feed-forward capacitor C1 and resistor R1 during negative slewing. This transient current during the negative slewing appears at the collector node (i.e., conductor 7) of transistor Q9 and then is amplified by the current gain β of transistor Q5 to generate the large amount of current needed to pull down the base voltage of output transistor Q2 to produce a very high negative slew rate of Vout.

For the opposite polarity of Vin, the amplification circuitry including transistors Q6 and Q10 is activated instead of the transistors Q5 and Q9, and during positive slewing the circuit behaves in an entirely analogous manner that described above so as to increase the voltage on the base of output transistor Q1 to produce a very high positive slew rate.

The controlled current sources 11 and 10 in amplifying circuitry 24A and 24B, respectively, are highly effective in providing enough base current to the output transistors Q1 and Q2.

In FIG. 4, transistors Q3, Q7, and Q9, and feed-forward capacitor C1 are included in circuitry 24A which controls negative slewing of diamond buffer amplifier 20, and transistors Q4, Q8, and Q10, and feed-forward capacitor C2 are included in circuitry 24B which controls positive slewing of diamond buffer amplifier 20. (Feed-forward capacitors C1 and C2 may have a capacitance of, for example, about 5 picofarad, so as to provide a high speed short circuit feed-forward path at frequencies above, for example, roughly 20-30 MHz. Of course, the overall bandwidth of the output stage can be scaled by changing the quiescent current of the output stage and adjusting the speed of the local loops accordingly.)

Figure 1:
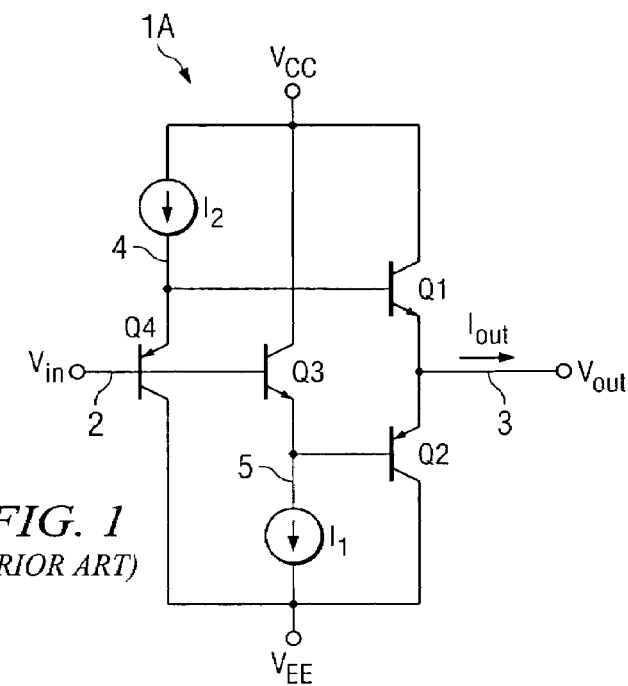
FIG. 1 is a schematic diagram of a conventional basic diamond buffer amplifier.
Figure 2:
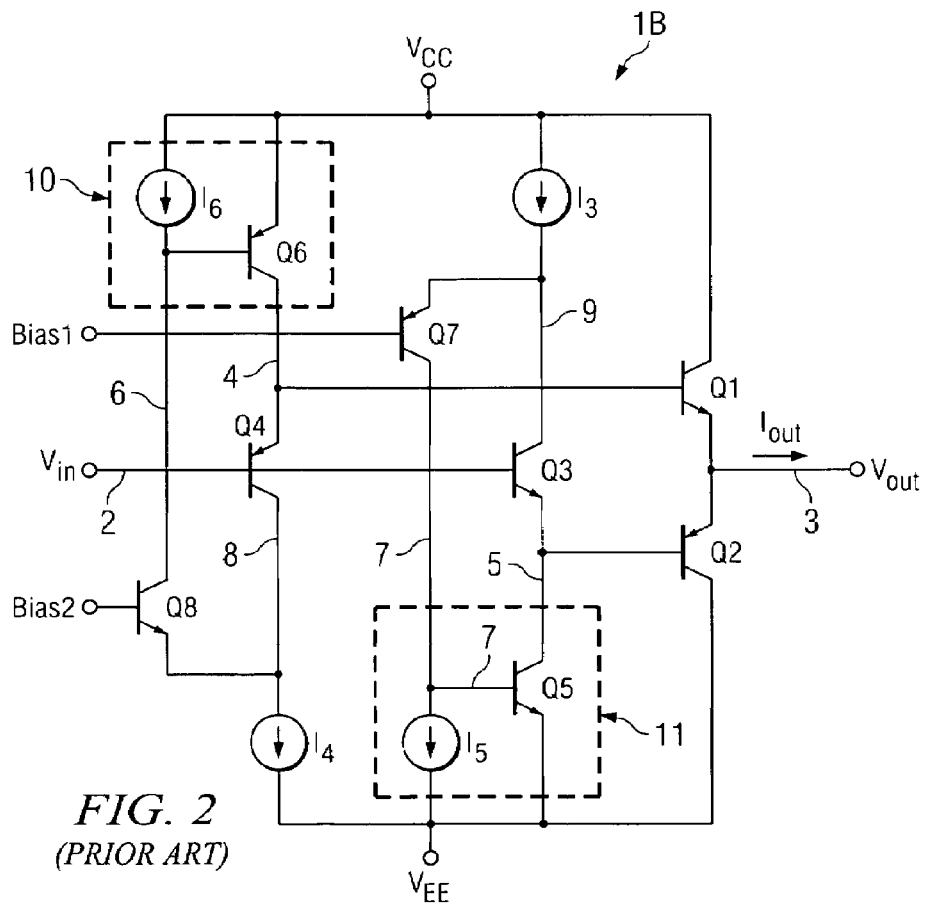
FIG. 2 is a simplified schematic diagram of a prior art diamond buffer amplifier, described in commonly owned U.S. Pat. No. 7,102,440 entitled "High Output Current Wideband Output Stage/Buffer Amplifier" issued Sep. 5, 2006 to Damitio et al.
Figure 3:
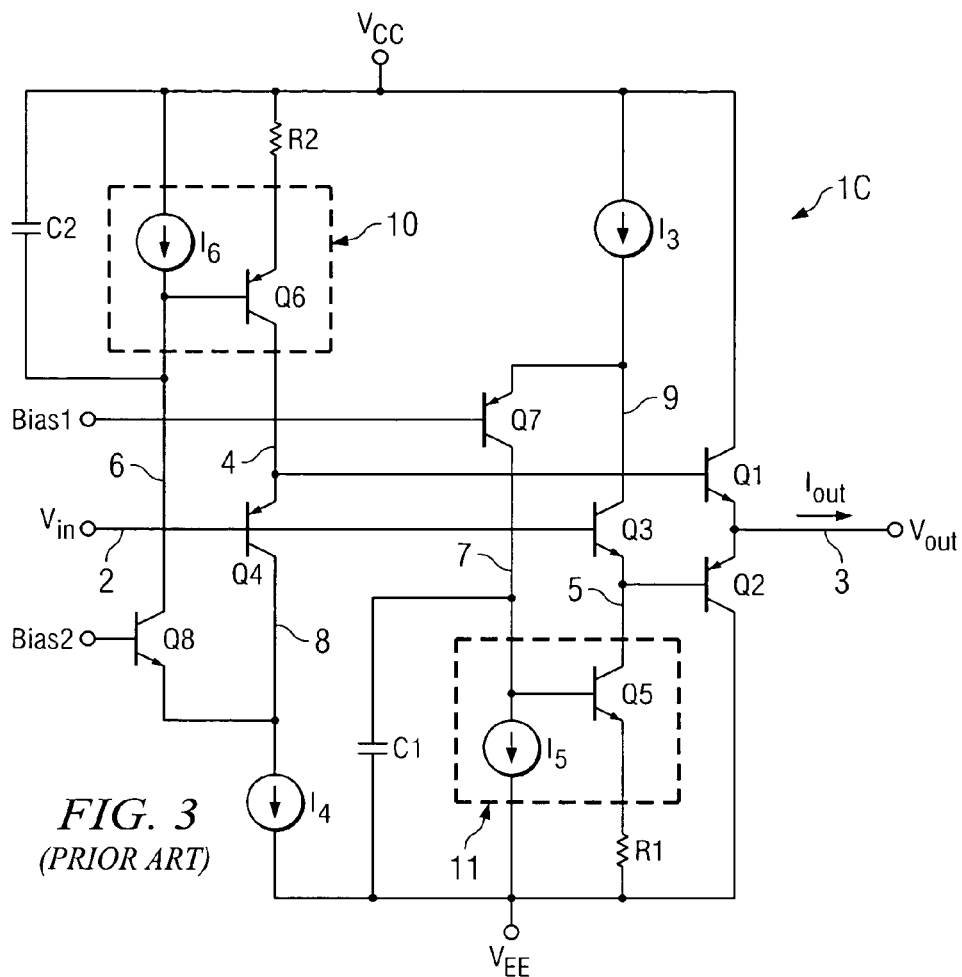
FIG. 3 is a schematic diagram of another prior art diamond buffer amplifier.
Figure 5:
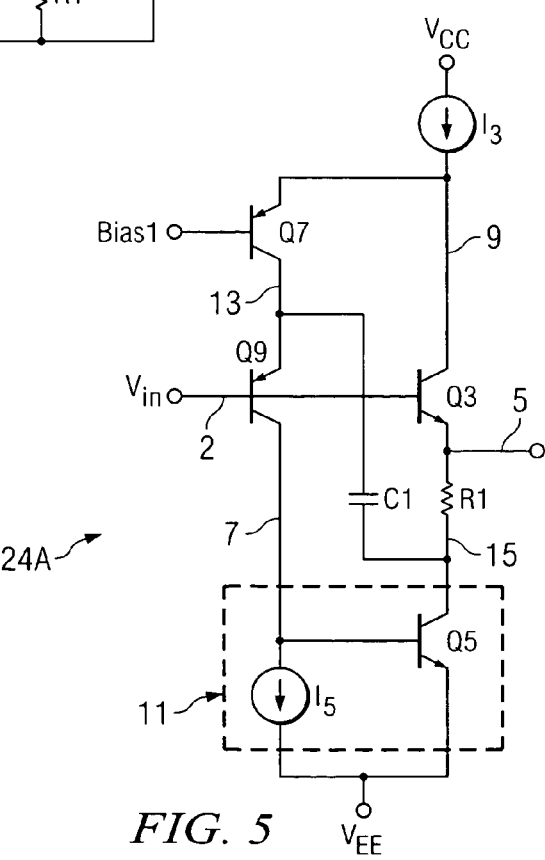
FIG. 5 is a schematic diagram of a stand-alone simplified buffer amplifier which includes a portion of the circuitry of FIG. 4.

The circuit 24A shown in FIG. 5 is a stand-alone version of the portion of the circuitry as indicated in FIG. 4 which drives the base of output transistor Q2, but does not include output transistor Q2. Simplified buffer amplifier circuit 24A in FIG. 5 includes transistors Q3, Q5, Q7 and Q9, resistor R1, feed-forward capacitor C1, and current sources $I_3$ and $I_5$ interconnected in the same way shown in FIG. 4. As in FIG. 4, transistor Q9 in FIG. 5 functions as a series current follower in the local feedback loop controlling the current of transistor Q5. Resistor R1 substantially electrically isolates the collector of transistor Q5 from conductor 5, which may have a large associated load capacitance. Feed-forward capacitor C1 closes the local feedback loop at high frequency through the short path consisting of the low high-frequency impedance of feed-forward capacitor C1. The amplification circuitry including transistors Q9 and Q5 is sufficiently stable that minimal or no local frequency compensation is required. This amplification circuitry therefore is very fast. Comments analogous to the foregoing are equally applicable to the circuit 24B in FIG. 4.

Circuits 24A and 24B can be used as a building blocks in various circuits, for example in operational amplifiers, and both circuits 24A and 24B benefit from all the advantages explained above (i.e., high speed and high current gain at high frequency). Specifically, buffer amplifier circuit 20A in FIG. 5 provides substantial improvement of slew rate performance and current gain at high frequency compared to the existing buffer topology. Stated differently, circuit 24A provides higher useful bandwidth when the circuit is sourcing or sinking a lot of current and also provides reduced settling times in operational amplifiers.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Amplifying circuitry comprising:
    (a) a first input transistor including an emitter, a collector, and a base coupled to receive an input voltage;
    (b) a first adjustable current source circuit coupled between a first reference voltage and the emitter of the first input transistor;
    (c) a first current source coupled between a second reference voltage and the collector of the first input transistor;
    (d) first isolation circuitry having a first terminal coupled to an output terminal of the first adjustable current source circuit and a second terminal coupled to the emitter of the first input transistor;
    (e) first current follower circuitry coupled between the collector of the first input transistor and an input terminal of the first adjustable current source circuit; and
    (f) a first feed-forward capacitor coupled between the collector of the first input transistor and the first terminal of the first isolation circuitry.

2. The amplifying circuitry of claim 1 wherein the first input transistor is an NPN transistor.

3. The amplifying circuitry of claim 1 wherein the first input transistor is a PNP transistor.

4. The amplifying circuitry of claim 1 wherein the first isolation circuitry is a first resistor.

5. The amplifying circuitry of claim 4 wherein the first current follower circuitry includes a PNP transistor having an emitter coupled to the collector of the first input transistor and a base coupled to receive a first bias voltage, and wherein the first current follower circuitry includes a PNP series current follower transistor having an emitter coupled to a collector of the PNP transistor, a base coupled to receive the input voltage, and a collector coupled to the input terminal of the first adjustable current source circuit, the first feed-forward capacitor having a first terminal coupled to the emitter of the PNP series current follower transistor and a second terminal coupled to the first terminal of the first isolation circuitry.

6. The amplifying circuitry of claim 4 wherein the first current follower circuitry includes an NPN transistor having an emitter coupled to the collector of the first input transistor and a base coupled to receive a first bias voltage, and wherein the first current follower circuitry includes an NPN series current follower transistor having an emitter coupled to a collector of the NPN transistor, a base coupled to receive the input voltage, and a collector coupled to the input terminal of the first adjustable current source circuit, the first feed-forward capacitor having a first terminal coupled to the emitter of the NPN series current follower transistor and a second terminal coupled to the first terminal of the first isolation circuitry.

7. The amplifying circuitry of claim 5 wherein the first adjustable current source circuit includes a second current source coupled between the collector of the PNP series current follower transistor and the first reference voltage, the collector of the PNP series current follower transistor being coupled to a base of a NPN current source output transistor having an emitter coupled to the first reference voltage and a collector coupled to the first terminal of the first isolation circuitry.

8. The amplifying circuitry of claim 1 wherein the first feed-forward capacitor functions above a predetermined frequency to contribute to providing a high speed short circuit feed-forward path between the emitter and collector of the first input transistor.

9. The amplifying circuitry of claim 1 including a first output transistor having an emitter coupled to an output conductor conducting an output voltage, a collector coupled to the first reference voltage, and a base coupled to the emitter of the first input transistor.

10. The amplifying circuitry of claim 9 wherein elements (a)-(f) and the first output transistor are included in a first amplifying circuit, the amplifying circuitry including a second amplifying circuit including (g) a second input transistor including a emitter, a collector, and a base coupled to receive the input voltage;

(h) a second adjustable current source circuit coupled between the second reference voltage and the emitter of the second input transistor;

(i) a second current source coupled between the first reference voltage and the collector of the second input transistor;

(j) second isolation circuitry having a first terminal coupled to an output terminal of the second adjustable current source circuit and a second terminal coupled to the emitter of the second input transistor;

(k) second current follower circuitry coupled between the collector of the second input transistor and an input terminal of the second adjustable current source circuit;

(l) a second feed-forward capacitor coupled between the collector of the second input transistor and the first terminal of the second isolation circuitry; and (m) the output transistor having a emitter coupled to the output conductor conducting the output voltage, a collector coupled to the second reference voltage, and a base coupled to the emitter of the second input transistor.

11. The amplifying circuitry of claim 10 wherein the first input transistor and the first output transistor of the first amplifying circuit are NPN and PNP transistors, respectively, and wherein the second input transistor and the second output transistor of the second amplifying circuit are PNP and NPN transistors, respectively.

12. The amplifying circuitry of claim 11 wherein:

the first current follower circuitry includes a PNP transistor having an emitter coupled to the collector of the first input transistor and a base coupled to receive a first bias voltage, and wherein the first current follower circuitry includes a PNP series current follower transistor having an emitter coupled to a collector of the PNP transistor, a base coupled to receive the input voltage, and a collector coupled to the input terminal of the first adjustable current source circuit, the first feed-forward capacitor having a first terminal coupled to the emitter of the PNP series current follower transistor and a second terminal coupled to the first terminal of the first isolation circuitry; and the second current follower circuitry includes an NPN transistor having an emitter coupled to the collector of the second input transistor and a base coupled to receive a second bias voltage, and wherein the second current follower circuitry includes an NPN series current follower transistor having an emitter coupled to a collector of the NPN transistor, a base coupled to receive the input voltage, and a collector coupled to the input terminal of the second adjustable current source circuit, the second feed-forward capacitor having a first terminal coupled to the emitter of the NPN series current follower transistor and a second terminal coupled to the first terminal of the first isolation circuitry.

13. The amplifying circuitry of claim 11 wherein:

the first adjustable current source circuit includes a third current source coupled between the collector of the PNP series current follower transistor and the first reference voltage, the collector of the PNP series current follower transistor being coupled to a base of a NPN current source output transistor having an emitter coupled to the first reference voltage and a collector coupled to the first terminal of the first isolation circuitry; and the second adjustable current source circuit includes a fourth current source coupled between the collector of the NPN series current follower transistor and the second reference voltage, the collector of the NPN series current follower transistor being coupled to a base of a PNP current source output transistor having an emitter coupled to the second reference voltage and a collector coupled to the first terminal of the second isolation circuitry.

14. A method of amplifying an input signal of amplifying circuitry, comprising:

(a) applying an input voltage to a base of an input transistor and a base of a current follower transistor;

(b) operating an adjustable current source circuit to produce a current and directing the current through an isolation resistor and an emitter of the input transistor;

(c) causing a change in a collector current of the input transistor to flow into an emitter of the current follower transistor;

(d) causing a change in a collector current of the current follower transistor to flow into a control input of the adjustable current source circuit; and (e) coupling a feed-forward capacitor between the emitter of the current follower transistor and an output of the adjustable current source circuit, to produce a signal voltage on the emitter of the input transistor having wide bandwidth and high current gain at high frequency operation.

15. The method of claim 14 including amplifying the input signal without coupling a substantial amount of compensation capacitance to the input of the adjustable current source circuit.

16. The method of claim 14 including coupling the first signal voltage to a base of an output transistor.

17. The method of claim 14 including operating the amplifying circuitry at a frequency greater than a predetermined frequency to cause the feed-forward capacitor to contribute to providing a fast short circuit feed-forward path between the emitter and collector of the input transistor.

18. An amplifying circuit for amplifying an input signal, comprising:

(a) means for applying an input voltage to a base of an input transistor and a base of a current follower transistor;

(b) means for operating in adjustable current source circuit to produce a current and directing the current through an isolation resistor and an emitter of the input transistor;

(c) means for causing a change in a collector current of the input transistor to flow into an emitter of the current follower transistor;

(d) means for causing a change in a collector current of the current follower transistor to flow into a control input of the adjustable current source circuit; and (e) means for coupling a feed-forward capacitor between the emitter of the current follower transistor and an output of the adjustable current source circuit, to produce a signal voltage on the emitter of the input transistor having wide bandwidth and high current gain at high frequency operation.

* * * * *